(12) United States Patent
McCullough et al.

(10) Patent No.: US 6,385,047 B1
(45) Date of Patent: May 7, 2002

(54) U-SHAPED HEAT SINK ASSEMBLY

(75) Inventors: Kevin A. McCullough, Warwick, RI (US); E. Mikhail Sagal, Watertown, MA (US)

(73) Assignee: Cool Shield, Inc., Warwick, RI (US)

( * ) Notice: Subject to any disclaimer, the term of this patent is extended or adjusted under 35 U.S.C. 154(b) by 0 days.

(21) Appl. No.: 09/692,555

(22) Filed: Oct. 19, 2000

Related U.S. Application Data

(60) Provisional application No. 60/169,084, filed on Dec. 6, 1999, and provisional application No. 60/178,909, filed on Feb. 1, 2000.

(51) Int. Cl.⁷ ................................................ H05G 7/20
(52) U.S. Cl. ...................... 361/704; 361/706; 361/709; 361/710; 257/706; 257/722; 174/16.3; 165/80.3 165/185
(58) Field of Search ................................ 361/688, 690, 361/695, 703, 704, 709, 710, 715, 717–720; 257/706, 717–719, 722; 174/15.1, 16.5; 165/80.2, 80.3, 185

(56) References Cited

U.S. PATENT DOCUMENTS

| 3,187,812 A | * | 6/1965 | Staver ......................... 165/185 |
| 3,217,793 A | | 11/1965 | Coe ............................ 165/80 |
| 3,219,885 A | | 11/1965 | Schniers ..................... 317/100 |
| 3,377,524 A | | 4/1968 | Bock et al. ................. 317/234 |
| 3,457,471 A | | 7/1969 | Moroney et al. ........... 317/234 |
| 4,552,206 A | | 11/1985 | Johnson et al. ............ 165/80.3 |
| 4,557,225 A | * | 12/1985 | Sagues et al. ............ 123/43.31 |
| 4,748,538 A | | 5/1988 | Tsuji .......................... 361/386 |
| 5,022,462 A | * | 6/1991 | Flint et al. ................. 165/80.4 |
| 5,521,439 A | | 5/1996 | Casati et al. ................ 257/718 |
| 5,521,792 A | * | 5/1996 | Pleitz et al. ................ 361/715 |
| 5,574,626 A | | 11/1996 | Smith ......................... 361/704 |
| 5,815,371 A | * | 9/1998 | Jeffries et al. ............. 361/704 |
| 6,068,051 A | * | 5/2000 | Wendt ........................ 165/185 |
| 6,201,700 B1 | * | 3/2001 | Tzinares et al. ........... 361/719 |

FOREIGN PATENT DOCUMENTS

| JP | 404071257 A | * | 3/1992 | ................ 257/713 |

OTHER PUBLICATIONS

IBM Technical Disclosure Bulletin, Mar. 1994, US, vol. 37, Issue 3, pp. 225–226.*

* cited by examiner

Primary Examiner—Boris L. Chervinsky
(74) Attorney, Agent, or Firm—Barlow, Josephs & Holmes, Ltd.

(57) ABSTRACT

A net-shape moldable U-shaped heat sink assembly formed by injection molding of a thermally conductive polymer composite material is shown. The heat sink assembly includes a base member with a number of integrated fins members thereon. A right upstanding wall extends from a first side of the base member and a left upstanding wall extends from a second side of the base member to form a substantially U-shaped heat sink assembly. To enhance thermal conductivity, fins members may be integrally formed into the base member, right wall and/or left wall during the molding of the heat sink assembly. Also, a flexible metallic substrate or hinges may be embedded within the U-shaped heat sink assembly to permit positioning of the right wall and left wall relative to the base member for custom configuration of the heat sink assembly.

12 Claims, 4 Drawing Sheets

U-SHAPED HEAT SINK ASSEMBLY

This application claims benefit of prov. No. 60/169,084 filed Dec. 6, 1999 and No. 60/178,909 filed Feb. 1, 2000.

BACKGROUND OF THE INVENTION

The present invention relates generally to the cooling of heat generating surfaces and objects. More specifically, the present invention relates to apparatuses for dissipating heat generated by such objects. In addition, the present invention relates to cooling of heat generating objects by use of composite materials and devices without the use of external fans to assist in cooling.

In industry, there are various parts and components that generate heat during operation. For example, in the electronics and computer industries, it is well known that computer components generate heat during operation. Various types of electronic device packages and integrated circuit chips, such as the PENTIUM central processing unit chip (CPU) manufactured by Intel Corporation and RAM (random access memory) chips are such devices that generate heat. These integrated circuit devices, particularly the CPU microprocessor chips, generate a great deal of heat during operation which must be removed to prevent adverse effects on operation of the system into which the device is installed. For example, a PENTIUM microprocessor, containing millions of transistors, is highly susceptible to overheating which could destroy the microprocessor device itself or other components proximal to the microprocessor.

There are a number of prior art methods to cool heat generating components and objects to avoid device failure and overheating, as discussed above. A block heat sink or heat spreader is commonly placed into communication with the heat generating surface of the object to dissipate the heat therefrom. Such a heat sink typically includes a base member with a number of individual cooling members, such as fins, posts or pins, to assist in the dissipation of heat. The geometry of the cooling members is designed to improve the surface area of the heat sink with the ambient air for optimal heat dissipation. The use of such fins, posts of pins in an optimal geometrical configuration greatly enhances heat dissipation compared to devices with no such additional cooling members, such as a flat heat spreader.

To further enhance air flow and resultant heat dissipation, fans and devices have been used, either internally or externally. However, these external devices consume power and have numerous moving parts. As a result, heat sink assemblies with active devices are subject to failure and are much less reliable than a device which is solely passive in nature.

It has been discovered that more efficient cooling of electronics can be obtained through the use of passive devices which require no external power source and contain no moving parts. It is very common in the electronics industry to have many electronic devices on a single circuit board, such as a motherboard.

There have been many prior art attempts to provide effective and efficient cooling to an array of devices on a circuit board that need to be cooled. Use of bulk heat sinks are expensive and cumbersome. Individual heat sinks for each device to be cooled are typically the same configuration which presents problems in effectively cooling devices in the middle of the array because they are not exposed directly to air flow within the environment at hand. For example, the outer heat sink assemblies in a row of heat sink assemblies installed on a corresponding row of RAM chips obstruct or block the flow of air within an environment from contacting the inner heat sink assemblies within a row. As a result, the heat dissipation of the heat sink assemblies in the middle of the row will provide inferior heat dissipation to the outer heat sink assemblies that are directly exposed to air flow within an environment.

Therefore, there is a demand for a passive heat sink assembly with no moving parts that can provide heat dissipation without the use of active components. In addition, there is a demand for a complete heat sink assembly that can provide greatly enhanced heat dissipation over prior an passive devices with improved heat sink geometry. There is a particular demand for a heat sink assembly to be customizable to given air flow environment. Further, there is a demand for a heat sink assembly that can be customized to be unique from other similar heat sink assemblies within an array to permit direct air flow to each of the heat sink assemblies in the in the array for maximum heat dissipation in each of the devices to be cooled in the array.

SUMMARY OF THE INVENTION

The present invention preserves the advantages of prior art heat dissipation devices, heat exchangers and heat spreaders. In addition, it provides new advantages not found in currently available devices and overcomes many disadvantages of such currently available devices.

The invention is generally directed to the novel and unique U-shaped heat sink assembly. The assembly of the present invention is net-shape molded of a thermally conductive polymer composition. The present invention relates to a molded heat sink assembly for dissipating heat from a heat generating source, such as a computer semiconductor chip or electronic components on a computer circuit board, such as a video card.

A net-shape moldable U-shaped heat sink assembly formed by injection molding of a thermally conductive polymer composite material is shown. The heat sink assembly includes a base member with a number of integrated fin members thereon. A right upstanding wall extends from a first side of the base member and a left upstanding wall extends from a second side of the base member to form a substantially U-shaped heat sink assembly. To enhance thermal conductivity, fin members may be integrally formed into the base member, right wall and/or left wall during the molding of the heat sink assembly. Also, a flexible metallic substrate or hinges may be embedded within the U-shaped heat sink assembly to permit positioning of the right wall and left wall relative to the base member for custom configuration of the heat sink assembly.

Further, since the heat sink assembly is injection molded, there is tremendous flexibility in the arrangement of all the arms, fins and base of the molded heat sink assembly. These various components may be easily optimized to suit the application at hand. For example, the fins may have different patterns, such as a radial or pin grid array, to suit the heat dissipation environment at hand.

As will be discussed in detail below, it is preferred that one base member and two opposing walls be provided for ease of assembly and installation. However, more than two upstanding walls may be provided to better suit different heat dissipating environments.

It is therefore an object of the present invention to provide a heat dissipating device that can provide enhanced heat dissipation for a heat generating component or object.

It is an object of the present invention to provide a heat dissipating device that can provide heat dissipation for semiconductor devices on a circuit board, such as a motherboard or video card.

A object of the present invention is to provide a heat sink assembly that can be easily customized to accommodate different heat dissipating environments.

It is another object of the present invention to provide an array of heat sink assemblies that can accommodate an array of heat generating objects while maximizing heat transfer.

It is a further object of the present invention to provide a heat dissipating device that has no moving parts.

Another object of the present invention is to provide a heat dissipating device that is completely passive and does not consume power.

A further object of the present invention is to provide a heat dissipation device that is inexpensive to manufacture.

Another object of the present invention is to provide a heat dissipation device that has a thermal performance greater than conventional heat sink designs.

A object of the present invention is to provide a heat dissipation device that is net-shape moldable and has an optimal fin configuration.

BRIEF DESCRIPTION OF THE DRAWINGS

The novel features which are characteristic of the present invention are set forth in the appended claims. However, the invention's preferred embodiments, together with further objects and attendant advantages, will be best understood by reference to the following detailed description taken in connection with the accompanying drawings in which:

DETAILED DESCRIPTION OF THE PREFERRED EMBODIMENT

Figure 1:
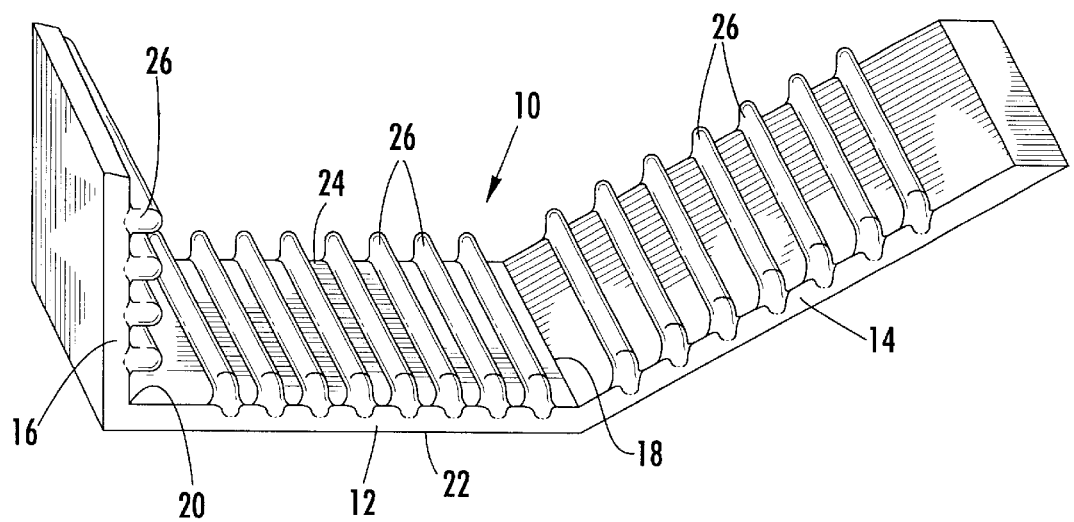
FIG. 1 is a perspective view of the preferred embodiment of the U-Shape heat sink assembly of the present invention.
Figure 2:
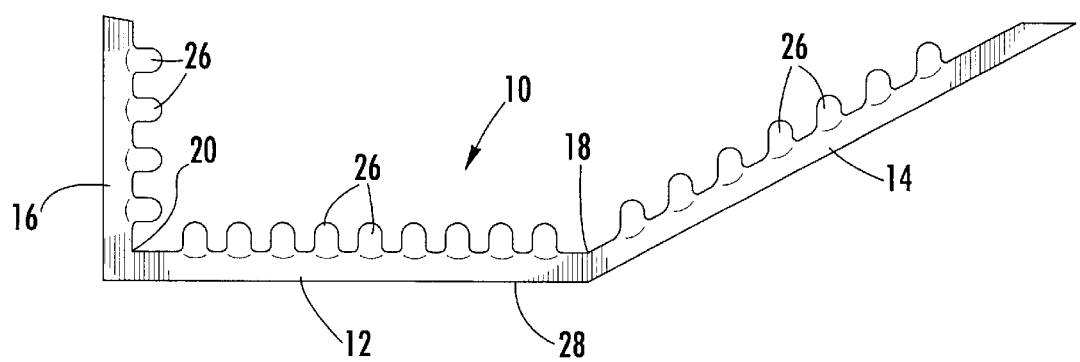
FIG. 2 is a side elevational view of the heat sink assembly of FIG. 1.

In FIGS. 1 and 2, the preferred embodiment of the net-shape molded heat sink assembly 10 of the present invention is shown. The heat sink assembly 10 includes a base member 12 with a right upstanding wall 14 integrally connected thereto. A left upstanding wall 16 is also integrally connected to the base member 12 preferably on an edge 20 of the base member that is opposite to the edge 18 to which the right wall is connected. In accordance with the present invention, additional walls (not shown) may be connected to the front edge 22 and/or back edge 24 of the base member 12 to suit the heat dissipation application at hand.

The heat sink assembly 10 is net-shape molded, such as by injection molding, into a unitary structure from thermally conductive material, such as a thermally conductive polymer composition. The thermally conductive polymer composition includes a base polymer of, for example, a liquid crystal polymer that is loaded with a conductive filler material, such as copper flakes or carbon fiber. Other base materials and conductive fillers may be used and still be within the scope of the present invention. Also, the heat sink assembly 10 of the present invention is net-shape molded which means that after molding it is ready for use and does not require additional machining or tooling to achieve the desire configuration of the part. Further, the heat sink assembly 10 of the present invention may be extruded, if desired.

The ability to injection mold a thermally conductive heat sink assembly, rather than machine it, has many advantages. As can be seen in FIGS. 1 and 2, fins 26 are preferably provided on various surfaces of the base member 12, right wall 14 and left wall 16 to further enhance the overall heat dissipation of the heat sink assembly 10. A linear fin arrangement 26 is shown by way of example. Other fins arrangements, such as a pin grid array (not shown), may be employed and still be within the scope of the present invention. Fins 26 and other heat dissipation enhancing elements may be provided on any surface of the heat sink assembly 10 other than the bottom surface 28 of the base member 12. As will be described below, the heat sink assembly 10 is placed in flush thermal communication with a heat generating surface of an object to be cooled via the flat bottom surface 28 of the base member 12 of the heat sink assembly 10.

The right wall 14 is shown connected to the base member 12 at an approximate 30 degree angle while the left wall 16 is connected to the base member 12 at an approximate 90 angle. This particular configuration is shown by way of example. The angle of interconnection of the right wall 14 and the left wall 16 may be modified to suit the application.

Figure 3:
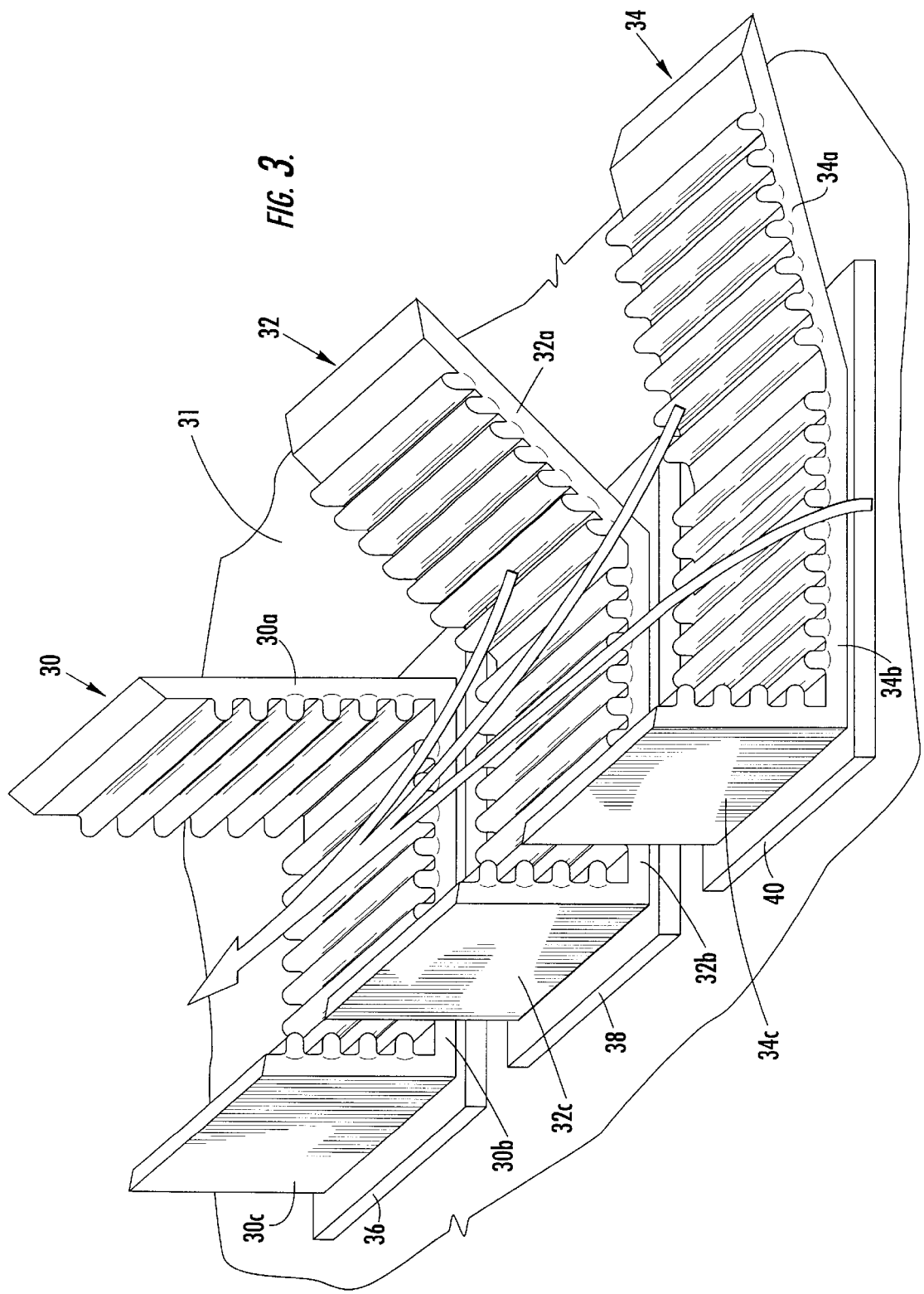
FIG. 3 is a perspective view of an array of U-shaped heat sink assemblies in accordance with the present invention.

Turning now to FIG. 3, an array of heat sink assemblies 30, 32 and 34 are shown respectively installed on an array of semiconductor devices 36, 38 and 40, such as RAM chips on a circuit board 31 for cooling. In this example, three different variations 30, 32 and 34 of the heat sink assembly 10 of the present invention are provided in an array aligned next to one another. In this example, the right walls 30a, 32a and 34a of each of the first assembly 30, the second assembly 32 and third assembly 34 are positioned relative to the base members 30b, 32b and 34b at a different angle than on another. The heat sink assemblies 30, 32 and 34 are preferably positioned on their respective devices 36, 38 and 40 to be cooled so that the channels defined by their respective base members 32b, 34b and 36b, right walls 30a, 32a and 34a and left walls 30c, 32c and 34c are substantially aligned. As seen in FIG. 3, each of the upstanding right walls 30a, 32a and 34a will directly receive air flow, as indicated by the arrows, in an unobstructed fashion to optimize the thermal transfer of each of the heat sink assemblies 30, 32 and 34. As a result, each of the heat sink assemblies 30, 32 and 34 will have optimal heat dissipation to ensure that none of the devices being cooled run hotter than another. In accordance with the present invention, each of the right upstanding walls 30a, 32a and 34a and left upstanding walls 30c, 32c and 34c of each assembly may be modified to optimize the overall thermal performance of the array of assemblies.

Figure 4:
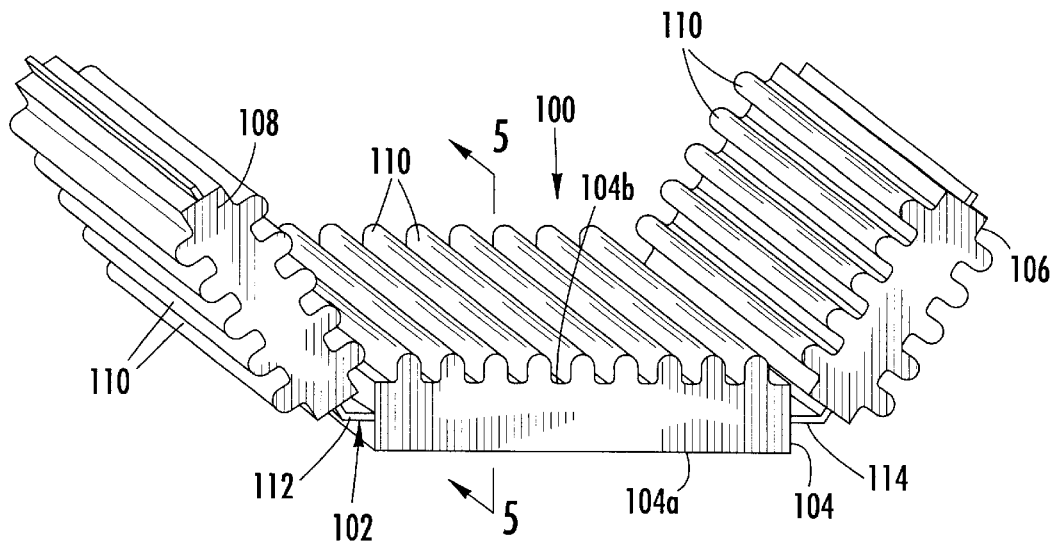
FIG. 4 is a perspective view of a first alternative embodiment of the present invention with a flexible substrate.
Figure 5:
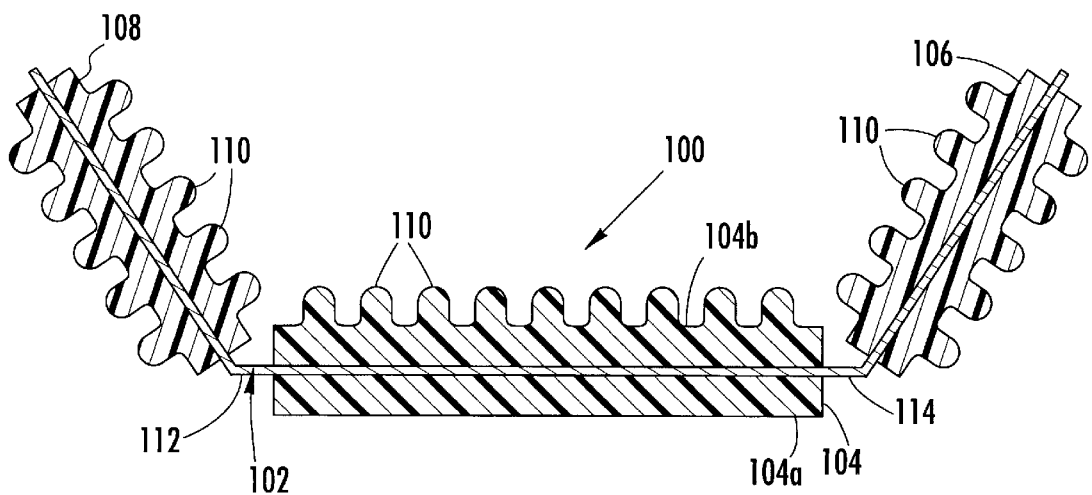
FIG. 5 is a cross-sectional view through the line 5—5 of FIG. 4.

Referring to FIGS. 4 and 5, a first alternative embodiment of the heat sink assembly 100 of the present invention is shown. In this embodiment, a flexible metallic substrate 102 is provided with overmolded thermally conductive plastic positioned over certain portions of the substrate. The flexible metallic substrate is preferably copper but may also be aluminum, for example. Known injection molding processes may be employed for actually overmolding the thermally conductive material about the substrate 102. Preferably, a central region 104, a right region 106 and a left region 108 of thermally conductive material is formed on and about the substrate 102. The central portion 104 of thermally conductive material preferably includes a flat bottom surface 104a and a top surface 104b with an array of fins 110 which serve as thermal transfer enhancing members. Similarly, the right region 106 and left region 108 of thermally conductive material includes fins 110 on both sides thereof to enhance thermal transfer. Preferably, the thermal transfer enhancing members are fins 110; however, they can be of other configurations such as a pin grid array.

In accordance with the present invention, the heat sink assembly 100 is placed into thermal communication with a heat generating object, such as microprocessor or RAM chip. These semiconductor devices typically have a flat upper surface. Therefore, the bottom surface 104a of the central region is flat to provide a flush thermal interface with the flat surface of the heat generating member. If the heat generating surface of the heat generating member is not flat, the bottom surface of the central region 104 can be formed to be of a complementary shape to the heat generating surface to provide a flush thermal interface with the heat generating object for optimum thermal transfer.

In FIGS. 4 and 5, joint or hinge portions 112 and 114 of the substrate are devoid of overmolded thermally conductive material to enable the portion of the substrate 102 carrying the right region 106 and the portion of the substrate carrying the left region 108 to be movable relative to the central region 104. As a result, the configuration of the heat sink assembly 100 can be easily customized by bending to suit the application at hand. Further, the heat sink assembly 100 of the alternative embodiment can be provided in an array in similar fashion to the preferred embodiment as shown in FIG. 3. As described above, in FIG. 3, three different configurations are provided to ensure that each heat sink assembly is exposed to air flow. Since the heat sink of the preferred embodiment 10 is a completely unitary molded object, it cannot be customized. Multiple molds must be employed to achieve different variations of the heat sink. To form an array with the alternative embodiment 100 of the present invention in similar fashion to FIG. 3, three identical heat sink assemblies may be provided on the three adjacent devices to be cooled with their respective channels aligned (not shown). The upstanding walls of each heat sink assembly 100 are bent as desired to optimize exposure to air flow to each one of the heat sink assemblies. For example, the configuration shown in FIG. 3 can be achieved by the heat sink assembly of the alternative embodiment by bending the right upstanding walls so that one is at about 30 degrees relative to ground, the second about 60 degrees relative to ground and the third about 90 degrees relative to ground.

Figure 6:
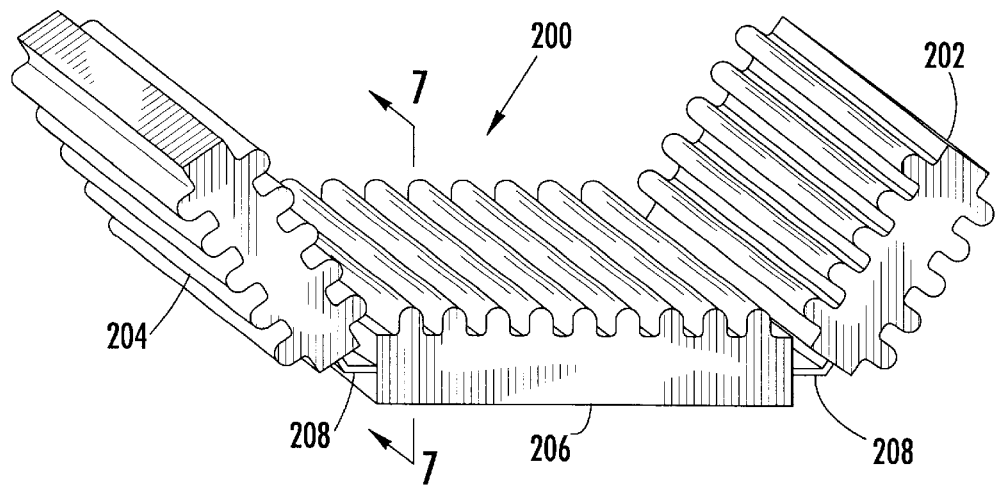
FIG. 6 is a perspective view of a second alternative embodiment of the present invention with flexible hinges.
Figure 7:
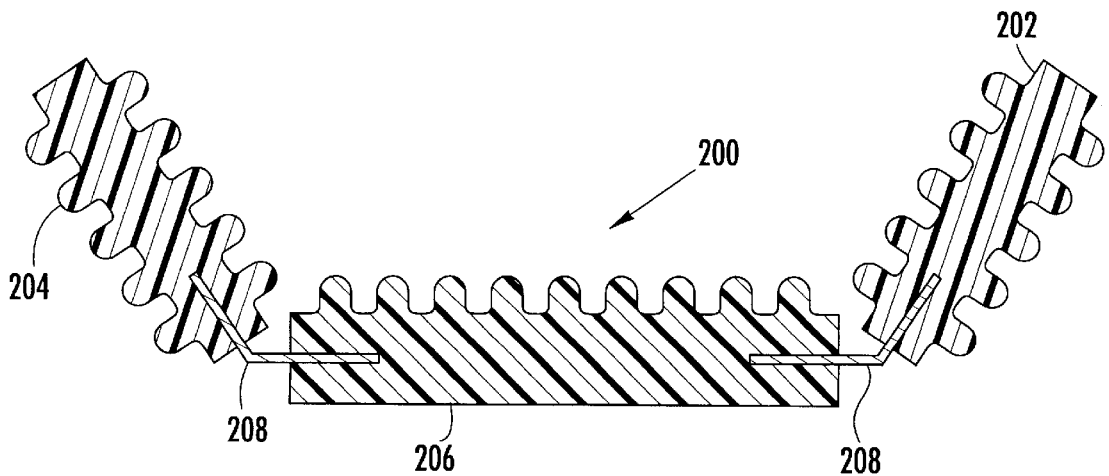
FIG. 7 is a cross-sectional view through the line 7—7 of FIG. 6.

In FIGS. 6 and 7, a second alternative embodiment 200 of the present invention is shown. This second alternative embodiment is a variation of the embodiment shown in FIGS. 4 and 5. In FIGS. 6 and 7, upstanding walls 202 and 204 are connected to base member 206 by flexible metallic hinges 208 as opposed to the full flexible metallic substrate 114 as shown in FIGS. 4 and 5. In certain applications, it may not be desirable to include a full substrate of metallic material. The embodiment 200 of the heat sink assembly of the present invention operates in identical fashion to the second embodiment 100 shown in FIGS. 4 and 5 in that the upstanding walls 202 and 204 are bent to adjustably customize each of the heat sink assemblies within an array for optimum exposure to air flow within an environment.

Each of the heat sink assemblies 10, 100 and 200 of the different embodiments of the present invention may be affixed to a heat generating object in many different ways and still be within the scope of the present invention. For example, a heat sink assembly may be affixed to a heat generating object by an adhesive, such as a thermally conductive epoxy, by the use of clamps, fasteners, or the like. Such devices for maintaining the heat sink assembly in thermal communication with a heat generating object may be selected depending on the environment and application at hand.

It would be appreciated by those skilled in the art that various changes and modifications can be made to the illustrated embodiments without departing from the spirit of the present invention. All such modifications and changes are intended to be covered by the appended claims.

What is claimed is:

1. A flexible heat sink assembly, comprising:

a flexible metallic base plate having a center portion, a left portion connected to one side of said center portion at a first junction and a right portion connected to an opposite side of said center portion as said left portion at a second junction;

a center overmolded heat transfer member having a bottom contact surface and a top surface; the center overmolded heat transfer member being positioned about the center portion of the flexible metallic base plate;

a left overmolded heat transfer member having a first and second sides; the left overmolded heat transfer member being positioned about the left portion of the flexible metallic base plate; the first and second sides of the left overmolded heat transfer member being exposed to ambient air;

a right overmolded heat transfer member having first and second sides; the right overmolded heat transfer member being positioned about the right portion of the flexible metallic base plate; the first and second sides of the right overmolded heat transfer member being exposed to ambient air;

said left portion being bendable relative to said center portion at said first junction;

said right portion being bendable relative to said center portion at second first junction.

2. The flexible heat sink assembly of claim 1, further comprising:

an array of fin members on said top surface of said center member.

3. The flexible heat sink assembly of claim 1, further comprising:

an array of fin members on said first side of said left overmolded heat transfer member.

4. The flexible heat sink assembly of claim 1, further comprising:

an array of fin members on said second side of said left overmolded heat transfer member.

5. The flexible heat sink assembly of claim 1, further comprising:

an array of fin members on said first side of said right overmolded heat transfer member.

6. The flexible heat sink assembly of claim 1, further comprising:

an array of fin members on said second side of said right overmolded heat transfer member.

7. The flexible heat sink assembly of claim 1, wherein said flexible metallic base plate is made of copper.

8. The flexible heat sink assembly of claim 1, wherein said center overmolded heat transfer member, said left overmolded heat transfer member and said right overmolded heat transfer member are made of a thermally conductive polymer composition.

9. A flexible heat sink assembly, comprising:

a center heat transfer member having a bottom contact surface, a top surface, a right side and a left side;

a right flexible hinge, having a first end and a second end; said first end of said right flexible hinge being embedded in said right side of said center heat transfer member;

a right overmolded heat transfer member having an exterior heat-dissipating surface; said second end of said right flexible hinge being embedded in said right overmolded heat transfer member with the entirety of the exterior heat-dissipating surface of the right overmolded heat transfer member being exposed to ambient air;

a left flexible hinge, having a first end and a second end; said first end of said left flexible hinge being embedded in said left side of said center heat transfer member;

a left overmolded heat transfer member having an exterior heat-dissipating surface; said second end of said left flexible hinge being embedded in said left overmolded heat transfer member with the entirety of the exterior heat-dissipating surface of the left overmolded heat transfer member being exposed to ambient air;

whereby said right overmolded heat transfer member is flexibly movable relative to said center heat transfer member via said right flexible hinge, and said left overmolded heat transfer member is flexibly movable relative to said center heat transfer member via second left flexible hinge.

10. The flexible heat sink assembly of claim 9, further comprising:

a plurality of integrated fins on said top surface of said center heat transfer member.

11. The flexible heat sink assembly of claim 9, further comprising:

a plurality of integrated fins on said right heat transfer member.

12. The flexible heat sink assembly of claim 9, further comprising:

a plurality of integrated fins on said left heat transfer member.

* * * * *